United States Patent
Takao

(10) Patent No.: US 8,101,496 B2
(45) Date of Patent: *Jan. 24, 2012

(54) METHOD OF MANUFACTURING BALL GRID ARRAY TYPE SEMICONDUCTOR DEVICE

(75) Inventor: Yukihiro Takao, Nitta-Gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/778,567

(22) Filed: May 12, 2010

(65) Prior Publication Data

US 2010/0221892 A1     Sep. 2, 2010

Related U.S. Application Data

(62) Division of application No. 10/855,974, filed on May 28, 2004, now Pat. No. 7,745,931.

(30) Foreign Application Priority Data

Jun. 9, 2003   (JP) ................. 2003-164115

(51) Int. Cl.
*H01L 21/76* (2006.01)

(52) U.S. Cl. ........ 438/406; 438/460; 438/629; 438/672; 257/698; 257/738; 257/E21.577

(58) Field of Classification Search .......... 438/406, 438/424, 462, 464, 629, 637, 638, 639, 672, 438/673, 674, 675, 455, 458, 460, 612, 613, 438/618; 257/698, 734, 738, 774, E21.577, 257/737, E23.021, E23.069, E21.627, E21.641, 257/E21.585, E21.599

See application file for complete search history.

(56) References Cited

U.S. PATENT DOCUMENTS

| 4,842,699 A | 6/1989 | Hua et al. |
| 4,964,212 A | 10/1990 | Deroux-Dauphin et al. |
| 5,608,264 A | 3/1997 | Gaul |

(Continued)

FOREIGN PATENT DOCUMENTS

CN   1453865 A   11/2003

(Continued)

OTHER PUBLICATIONS

European Office Action issued Feb. 16, 2010 directed to Application No. 04 012 460.4; 5 pages, Feb. 16, 2010.

(Continued)

*Primary Examiner* — Khiem D Nguyen

(74) *Attorney, Agent, or Firm* — Morrison & Foerster LLP

(57) ABSTRACT

A BGA type semiconductor device having high reliability is offered. A pad electrode is formed on a surface of a semiconductor substrate and a glass substrate is bonded to the surface of the semiconductor substrate. A via hole is formed from a back surface of the semiconductor substrate to reach a surface of the pad electrode. An insulation film is formed on an entire back surface of the semiconductor substrate including an inside of the via hole. A cushioning pad is formed on the insulation film. The insulation film is removed from a bottom portion of the via hole by etching. A wiring connected with the pad electrode is formed to extend from the via hole onto the cushioning pad. A conductive terminal is formed on the wiring. Then the semiconductor substrate is separated into a plurality of semiconductor dice.

14 Claims, 16 Drawing Sheets

U.S. PATENT DOCUMENTS

| | | | |
|---|---|---|---|
| 5,646,432 | A | 7/1997 | Iwaki et al. |
| 6,020,217 | A | 2/2000 | Kuisl et al. |
| 6,124,179 | A | 9/2000 | Adamic, Jr. |
| 6,277,669 | B1 | 8/2001 | Kung et al. |
| 6,319,846 | B1 | 11/2001 | Lin et al. |
| 6,379,982 | B1 | 4/2002 | Ahn et al. |
| 6,392,290 | B1 | 5/2002 | Kasem et al. |
| 6,479,900 | B1 | 11/2002 | Shinogi et al. |
| 6,646,289 | B1 | 11/2003 | Badehi |
| 6,703,689 | B2 * | 3/2004 | Wada ............................ 257/621 |
| 6,777,612 | B2 | 8/2004 | Sugiura et al. |
| 6,800,815 | B1 | 10/2004 | Ehlert et al. |
| 6,808,643 | B2 | 10/2004 | Ho et al. |
| 7,067,354 | B2 | 6/2006 | Prabhu |
| 7,413,931 | B2 * | 8/2008 | Noma et al. ................. 438/114 |
| 2002/0019069 | A1 | 2/2002 | Wada |
| 2002/0030198 | A1 * | 3/2002 | Coman et al. ................. 257/103 |
| 2002/0038890 | A1 | 4/2002 | Ohuchi |
| 2002/0119652 | A1 | 8/2002 | Hill |
| 2003/0025173 | A1 * | 2/2003 | Suminoe et al. ............. 257/459 |
| 2003/0155408 | A1 | 8/2003 | Fanti et al. |
| 2003/0230805 | A1 * | 12/2003 | Noma et al. .................. 257/737 |
| 2004/0110316 | A1 | 6/2004 | Ogihara et al. |
| 2004/0161920 | A1 | 8/2004 | Noma |
| 2004/0248343 | A1 | 12/2004 | Brintzinger et al. |

FOREIGN PATENT DOCUMENTS

| | | |
|---|---|---|
| EP | 1 416 529 | 5/2004 |
| EP | 1 429 377 | 6/2004 |
| EP | 1 482 552 | 12/2004 |
| JP | 5-29537 | 2/1993 |
| JP | 5-313201 | 11/1993 |
| JP | 2000-091339 | 3/2000 |
| JP | 2000-195861 | 7/2000 |
| JP | 2000-216184 | 8/2000 |
| JP | 2002-94082 | 3/2002 |
| JP | 2002-512436 | 4/2002 |
| WO | WO-99/40624 | 8/1999 |
| WO | WO-03/019653 | 3/2003 |

OTHER PUBLICATIONS

European Search Report mailed on Feb. 27, 2007, directed to European Patent Application No. 04012460.4; 4 pages, Feb. 27, 2007.

Takao, Y., U.S. Office Action mailed May 5, 2006, directed to U.S. Appl. No. 10/855,974; 8 pages, May 5, 2006.

Takao, Y., U.S. Office Action mailed Oct. 26, 2006 directed to U.S. Appl. No. 10/855,974; 13 pages, Oct. 26, 2006.

Takao, Y., U.S. Office Action mailed Apr. 23, 2007, directed to U.S. Appl. No. 10/855,974; 12 pages, Apr. 23, 2007.

Takao, Y., U.S. Office Action mailed Oct. 30, 2007, directed to U.S. Appl. No. 10/855,974; 11 pages, Oct. 30, 2007.

Takao, Y., U.S. Office Action mailed Apr. 15, 2008, directed to U.S. Appl. No. 10/855,974; 14 pages, Apr. 15, 2008.

Takao, Y., U.S. Office Action mailed Oct. 21, 2008, directed to U.S. Appl. No. 10/855,974; 18 pages, Oct. 21, 2008.

Takao, Y., U.S. Office Action mailed Apr. 2, 2009, directed to U.S. Appl. No. 10/855,974; 22 pages, Apr. 2, 2009.

Takao, Y., U.S. Office Action mailed Nov. 2, 2009, directed to U.S. Appl. No. 10/855,974; 23 pages, Nov. 2, 2009.

Noma, T. et al., U.S. Office Action mailed Jul. 25, 2007, directed to U.S. Appl. No. 11/225,898; 10 pages, (Jul. 25, 2007).

Noma, T. et al., U.S. Office Action mailed Feb. 4, 2008 directed to U.S. Appl. No. 11/225,898; 10 pages, (Feb. 4, 2008).

European Search Report dated Feb. 13, 2006, directed to related EP Application No. 05020906.3; 7 pages, (Feb. 13, 2006).

* cited by examiner

METHOD OF MANUFACTURING BALL GRID ARRAY TYPE SEMICONDUCTOR DEVICE

CROSS-REFERENCE OF THE INVENTION

This application is a divisional of U.S. application Ser. No. 10/855,974, filed May 28, 2004, now U.S. Pat. No. 7,745,931, which claims priority of Japanese Patent Application No. 2003-164115, filed Jun. 9, 2003, the contents of which are incorporated herein by reference in their entireties.

BACKGROUND OF THE INVENTION

1. Field of the Invention

This invention relates to a BGA (Ball Grid Array) type semiconductor device which has a plurality of ball-shaped conductive terminals and its manufacturing method.

2. Description of the Related Art

A CSP (Chip Size Package) has received attention in recent years as a three-dimensional mounting technology as well as a new packaging technology. The CSP means a small package having about the same outside dimensions as those of a semiconductor die packaged in it.

A BGA type semiconductor device has been known as a kind of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by compression bonding of the conductive terminals to wiring patterns on the printed circuit board.

Such a BGA type semiconductor device has advantages in providing a large number of conductive terminals and in reducing size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 28A and 28B show outline structure of a conventional BGA type semiconductor device. FIG. 28A is an oblique perspective figure showing a top side of the BGA type semiconductor device. And FIG. 28B is an oblique perspective figure showing a back side of the BGA type semiconductor device.

A semiconductor die 104 is sealed between a first glass substrate 102 and a second glass substrate 103 through epoxy resin layers 105a and 105b in the BGA type semiconductor device 101. A plurality of conductive terminals 106 is arrayed in a grid pattern on a principal surface of the second glass substrate 103, that is, on a back surface of the BGA type semiconductor device 101. The conductive terminals 106 are connected to the semiconductor die 104 through a plurality of second wirings 110. The plurality of second wirings 110 is connected with aluminum first wirings 107 pulled out from inside of the semiconductor die 104, making each of the conductive terminals 106 electrically connected with the semiconductor die 104.

More detailed explanation on a cross-sectional structure of the BGA type semiconductor device 101 will be given hereafter referring to FIG. 29. FIG. 29 shows a cross-sectional view of the BGA type semiconductor devices 101 divided along dicing lines into individual dice.

The first wiring 107 is provided on an insulation film 108 on a top surface of the semiconductor die 104. The semiconductor die 104 is bonded to the first glass substrate 102 with the resin layer 105a. A back surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. And the ball-shaped conductive terminal 106 is formed on the second wiring 110 extended onto the second glass substrate 103.

However, there is a possibility that the first wiring 107 and the second wiring 110 are disconnected at a point of contact between them, since the area of the point of contact is very small in the BGA type semiconductor device 101 described above. Also there is a problem in step coverage of the second wiring 110.

SUMMARY OF THE INVENTION

The invention provides a method of manufacturing a semiconductor device. The method includes bonding a supporting substrate to a first surface of a semiconductor substrate on which a pad electrode is formed, forming a via hole in the semiconductor substrate connecting a second surface of the semiconductor substrate and a surface of the pad electrode, forming an insulation film on the second surface of the semiconductor substrate and an inside wall of the via hole, removing the insulation film at a bottom portion of the via hole to expose the pad electrode, forming a wiring contacting the exposed pad electrode through the via hole and extending over the second surface from the via hole, forming a conductive terminal on the wiring, and dividing the semiconductor substrate into a plurality of semiconductor dice.

The invention also provides a semiconductor device that includes a semiconductor substrate having a via hole and a pad electrode disposed on a first surface of a semiconductor substrate. The via hole connects a second surface of the semiconductor substrate and a surface of the pad electrode. The device also includes a supporting substrate bonded to the first surface of the semiconductor substrate, a cushioning pad formed on the second surface of the semiconductor substrate excluding a region adjacent the via hole, a wiring contacting the pad electrode through the via hole and extending over the cushioning pad from the via hole, and a conductive terminal formed on a portion of the wiring disposed on the cushioning pad and in contact with the portion of the wiring.

DETAILED DESCRIPTION OF THE INVENTION

Figure 12:
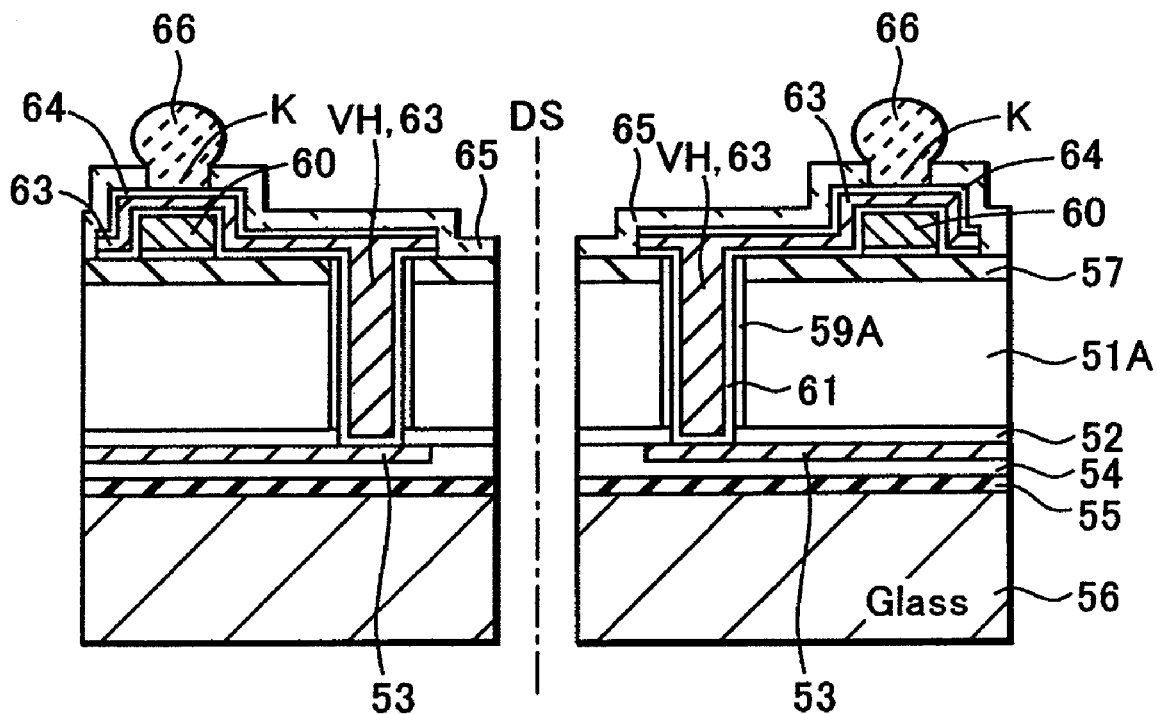
FIG. 12 is a cross-sectional view showing the manufacturing method of the semiconductor device according to the first embodiment of this invention.

Next, a first embodiment of this invention will be described in detail, referring to figures hereinafter. First, a structure of the semiconductor device will be described. FIG. 12 is a cross-sectional view of the semiconductor device separated into individual dice by dicing a silicon wafer along a dicing line after process steps to be described hereinafter. DS in FIG. 12 denotes a center of the dicing line.

A silicon die 51A is a CCD (Charge Coupled Device) image sensor chip, for example. A pad electrode 53 is formed on a surface which is a first surface of the silicon die 51A through an interlayer insulation film 52 such as a BPSG (Boro-Phospho Silicate Glass) film. The pad electrode 53 is formed by extending a normal pad electrode used for wire bonding to the dicing line region and is also called an extended pad electrode.

The pad electrode 53 is covered with a passivation film 54 made of a silicon nitride film, for example. A glass substrate 56 is bonded through a resin layer 55 made of an epoxy resin, for example, to the surface of the silicon die 51A, on which the pad electrode 53 is formed. The glass substrate 56 is used as a protection substrate to protect the silicon die 51A as well as a supporting substrate to bolster the silicon die 51A.

When the silicon die 51A is the CCD image sensor chip, using a transparent substrate such as the glass substrate 56 or a semitransparent substrate is required because light from outside needs to be received with the CCDs on the surface of the silicon die 51A. An opaque substrate may be used when the silicon die 51A is not a light-receiving or a light-emitting chip.

A via hole VH is formed in the silicon die 51A from a second surface which is a back surface of the silicon die 51A and to reach the pad electrode 53. A sidewall insulation film 59A is formed on a sidewall of the via hole VH. The sidewall insulation film 59A isolates the silicon die 51A from a wiring 63.

A cushioning pad 60 is formed on the back surface of the silicon die 51A in a region adjacent the via hole VH through a first insulation film 57.

A wiring 63 electrically connected to the pad electrode 53 through the via hole VH is formed to extend from the via hole VH and to run over the back surface of the silicon die 51A. A layer of the wiring 63 is also called a re-distribution layer, and has a structure of a layer of barrier metal such as Ni/Au stacked on a layer of copper (Cu), for example.

A seed layer 61 is provided under the wiring 63. The seed layer 61 is a metal layer serving as a plating electrode in forming the wiring 63 by electrolytic plating. The wiring 63 extends over the back surface of the silicon die 51A to cover the cushioning pad 60.

The wiring 63 is covered with a solder mask 65 which makes a protection film. An opening K is formed in the solder mask 65 above the cushioning pad 60. A solder ball 66 which makes the conductive terminal is mounted through the opening K in the solder mask 65. The solder ball 66 is hereby electrically connected with the wiring 63. A BGA structure is obtained by forming a plurality of such solder balls 66.

The connection between the pad electrode 53 on the silicon die 51A and the solder ball 66 formed on its back surface is formed as described above. Since the connection is made through the via hole VH, disconnection occurs hardly and step coverage is excellent. In addition, mechanical strength of the connection is high.

Also, damage to the solder balls and the semiconductor device itself is prevented, since the solder ball 66 is disposed on the cushioning pad 60 which serves as a kind of cushion when the semiconductor device is mounted on a printed circuit board through the solder ball 66.

Furthermore, the solder ball 66 is formed at a location elevated by a thickness of the cushioning pad 60 above the back surface of the silicon die 51A. Because of that, the solder ball 66 and the silicon die 51A are better protected from potential damage caused by stress due to difference in coefficients of thermal expansion between the printed circuit board and the solder ball 66, when the semiconductor device is mounted on the printed circuit board.

The cushioning pad 60 may be made of a material chosen from various materials such as an organic insulator, inorganic insulator, metal, silicon and photoresist. Materials having high flexibility such as the organic insulator, the inorganic insulator and the photoresist are better suited to serve as a cushion.

The silicon die 51A may be replaced with a die made of other semiconductor material such as GaAs, Ge or Si—Ge. The glass substrate 56 preferably has a thermal expansion coefficient Kg which is close to a thermal expansion coefficient Ks of the silicon wafer 51. The preferable thermal expansion coefficient Kg is in a range of ±30% of the thermal expansion coefficient Ks (2.6-3.0 ppm/° K.). In other words, an relationship $0.7\ Ks \leq Kg \leq 1.3\ Ks$ should be established, where Kg denotes the thermal expansion coefficient of the glass substrate 56 and Ks denotes the thermal expansion coefficient of the silicon wafer 51.

With this, warping of the glass substrate 56 due to the difference in the thermal expansion coefficients between the glass substrate 56 and the silicon wafer 51 is prevented. The same applies to a case in which the silicon die 51A is replaced with the die made of the other semiconductor material.

Figure 1:
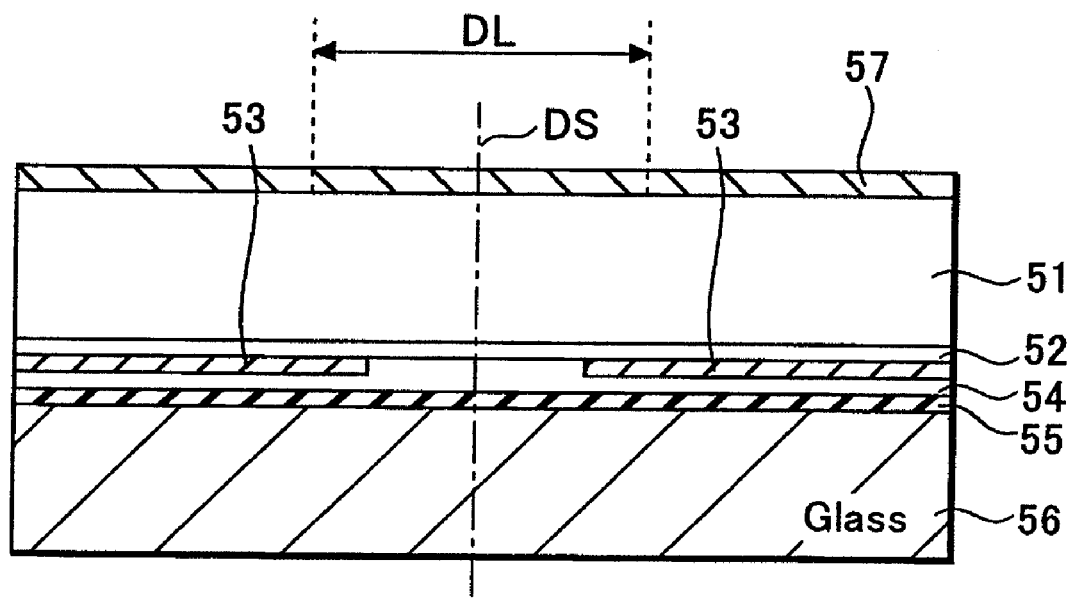
FIG. 1 is a cross-sectional view showing a manufacturing method of a semiconductor device according to a first embodiment of this invention.

Next, a manufacturing method of the semiconductor device will be described hereinafter. It is assumed that a semiconductor integrated circuit (a CCD image sensor, for example, not shown) is formed on the surface which is the first surface of a silicon wafer 51, as shown in FIG. 1. FIG. 1 shows a cross-section of neighboring dice around a border along which the dice are to be separated in a dicing process to be described below.

A pair of pad electrodes 53 is formed on a surface of the silicon wafer 51 through the interlayer insulation film 52 such as BPSG (Boro-Phospho Silicate Glass). The pair of pad electrodes 53 is made of a layer of metal such as aluminum, aluminum alloy or copper, and is about 1 μm thick. The pair of pad electrodes 53 is extended into a dicing line region DL with their extended ends disposed close to the center line DS of the dicing line.

The passivation film 54 made of a silicon nitride film, for example, is formed to cover the pair of pad electrodes 53 and a resin layer 55 made of an epoxy resin, for example, is applied to the passivation film 54.

Then the glass substrate 56 is bonded to the surface of the silicon wafer 51 through the resin layer 55. The glass substrate 56 works as a substrate to protect and bolster the silicon wafer 51. After the glass substrate 56 is bonded, thickness of the silicon wafer 51 is reduced to about 150 μm by back surface etching or so-called back-grinding when needed.

Then a top portion of the back surface of the silicon wafer 51 is etched off by about 20 μm using an acid (a mixed solution of hydrogen fluoride and nitric acid, for example) as an etchant. The etching removes a mechanically damaged layer of silicon wafer 51 caused by the back-grinding and is effective to improve characteristics of a device formed in the surface of the silicon wafer 51. Although the finished thickness of the silicon wafer 51 is about 130 μm in this embodiment, it may be chosen depending on kinds of devices formed on the silicon wafer 51.

The first insulation film 57 is formed on the entire back surface of the silicon wafer 51, the top portion of which has been removed in the process step described above. The first insulation film 57 is formed by plasma CVD (Chemical Vapor Deposition), for example, and a PE-SiO2 film and a PE-SiN film are suitable for it.

Figure 2:
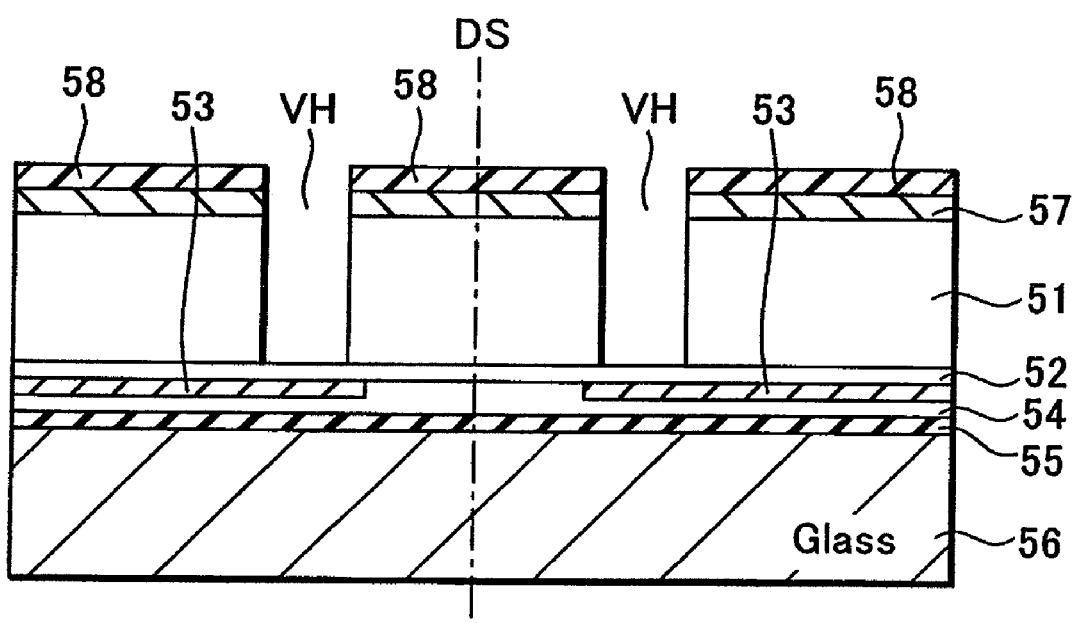
FIG. 2 is a cross-sectional view showing the manufacturing method of the semiconductor device according to the first embodiment of this invention.

Next, a photoresist layer 58 is formed selectively on the first insulation film 57 and the via holes VH penetrating the silicon wafer 51 are formed by etching the first insulation film 57 and the silicon wafer 51 using the photoresist layer 58 as a mask, as shown in FIG. 2. The interlayer insulation film 52 is exposed at the bottom of the via holes VH. The pad electrodes 53 are next to the interlayer insulation film 52. Width of the via hole VH is about 40 μm and its length is about 200 μm.

The via holes VH may be formed by etching using a laser beam or by dry etching. The via hole VH is preferably formed to have tapered cross-sectional shape in order to improve coverage of the seed layer 61, which will be described below.

Figure 3:
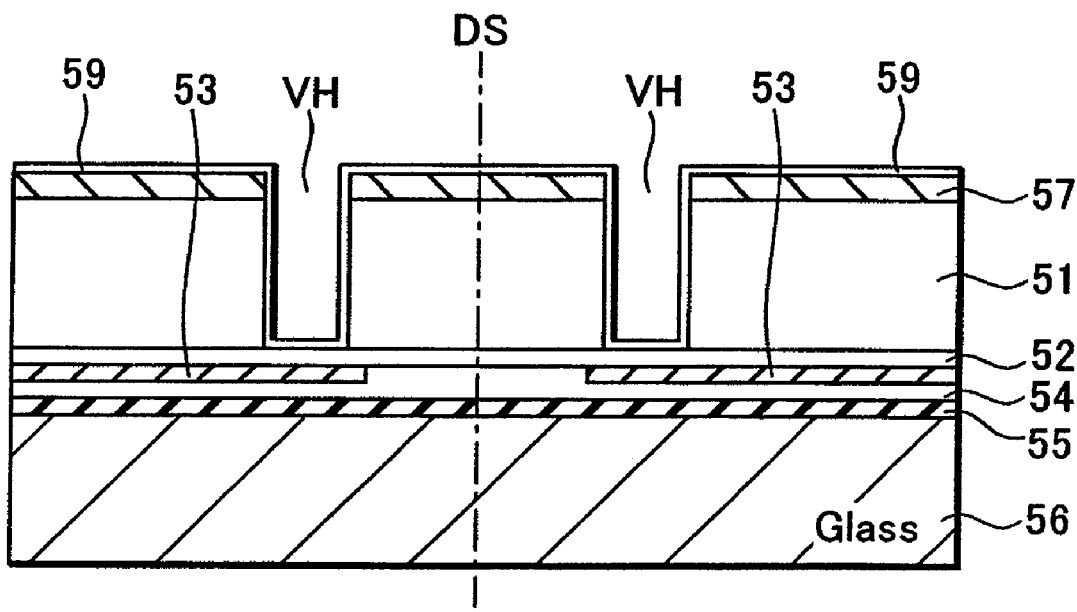
FIG. 3 is a cross-sectional view showing the manufacturing method of the semiconductor device according to the first embodiment of this invention.

Next, a second insulation film 59 is formed on the entire back surface of the silicon wafer 51 in which the via holes VH are formed, as shown in FIG. 3. The second insulation film 59 is formed by plasma CVD (Chemical Vapor Deposition), for example, and a PE-SiO2 film and a PE-SiN film are suitable for it. The second insulation film 59 is formed on the bottom and the sidewall of each of the via holes VH and on the first insulation film 57.

Figure 4:
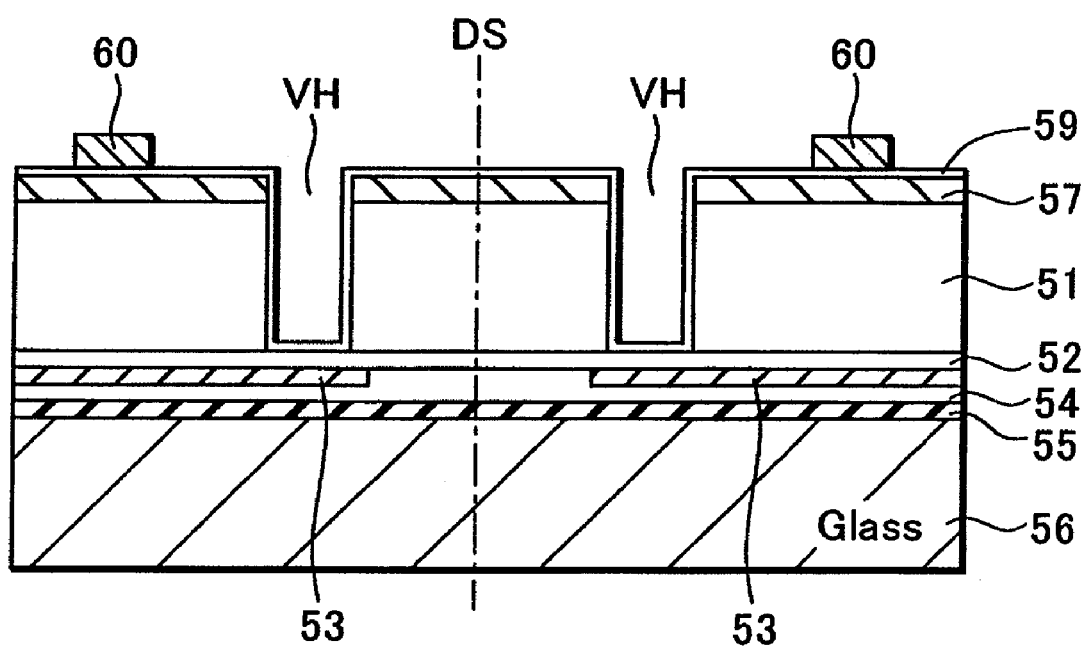
FIG. 4 is a cross-sectional view showing the manufacturing method of the semiconductor device according to the first embodiment of this invention.

Next, the cushioning pads 60 are formed on the second insulation film 59 at locations adjacent to the via holes VH, as shown in FIG. 4. The cushioning pads 60 can be formed in pre-determined regions using a film resist and by exposure with a mask and development. Not limited to the above, the cushioning pad 60 may be formed of a material chosen from various materials such as an organic insulator, inorganic insulator, metal, silicon and photoresist. Materials having high flexibility such as the organic insulator, the inorganic insulator and the photoresist are better suited to serve as a cushion.

Figure 5:
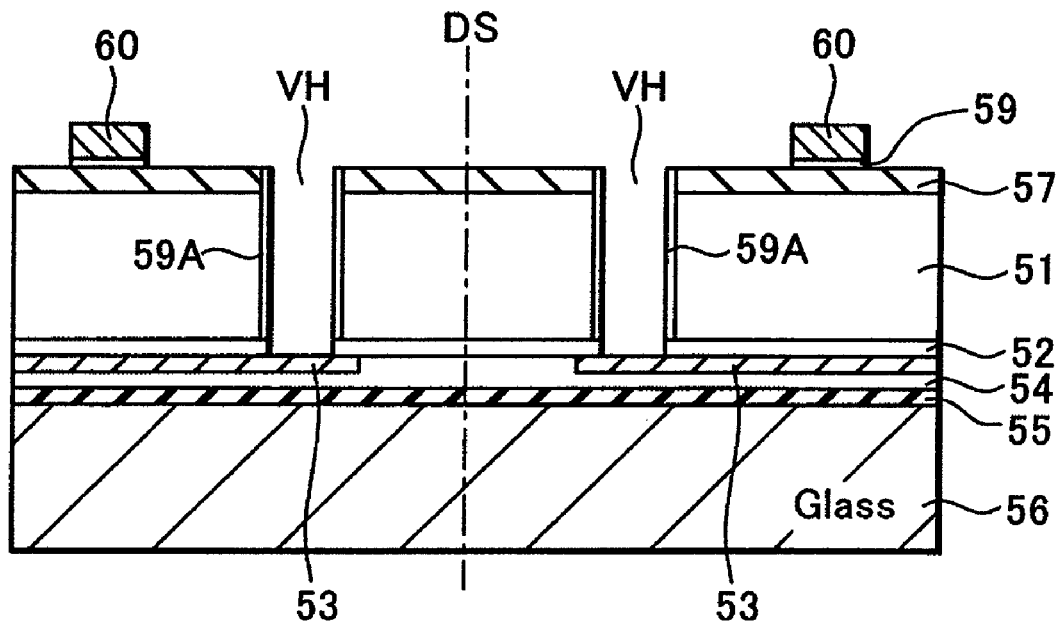
FIG. 5 is a cross-sectional view showing the manufacturing method of the semiconductor device according to the first embodiment of this invention.

Next, anisotropic dry etching is performed without using a photoresist layer, as shown in FIG. 5. The second insulation film 59 remains only on the sidewall of each of the via holes VH, making the sidewall insulation film 59A. The second insulation film 59 and the interlayer insulation film 52 at the bottom of the via holes VH are etched off in this etching process to expose the pad electrodes 53. The process step to form the first insulation film 57 may be omitted if the manufacturing method is modified so that only the second insulation film 59 at the bottom of the via hole VH is removed in etching the second insulation film 59.

The second insulation film 59 is formed in the via holes VH after the via holes VH are formed and the second insulation film 59 and the interlayer insulation film 52 at the bottom of each of the via holes VH are removed by etching to expose the pad electrodes 52 after the cushioning pads 60 are formed in this embodiment as described above.

On the contrary, it is also possible that the cushioning pads 60 are formed after the bottom of each of the via holes VH are etched to expose the pad electrodes 52. In this case, however, there is a possibility that the bottom of each of the via holes VH might be contaminated when the cushioning pads 60 are formed, resulting in a failure in an electrical connection between the pad electrode 53 and the wiring 63, which will be formed later in the via hole VH. Therefore it is preferable for the sake of better electrical connection between the wiring 63 and the pad electrode 53 that the bottom of each of the via holes VH is etched after the cushioning pads 60 are formed, as in the embodiment.

The sidewall insulation film 59A is formed by etching the insulation film in the via hole VH after forming the cushioning pad 60, in the process step shown in FIG. 5. The etching makes a surface of the cushioning pad 60 rough, benefiting it from increased adhesiveness to the seed layer 61, which will be described below.

Figure 6:
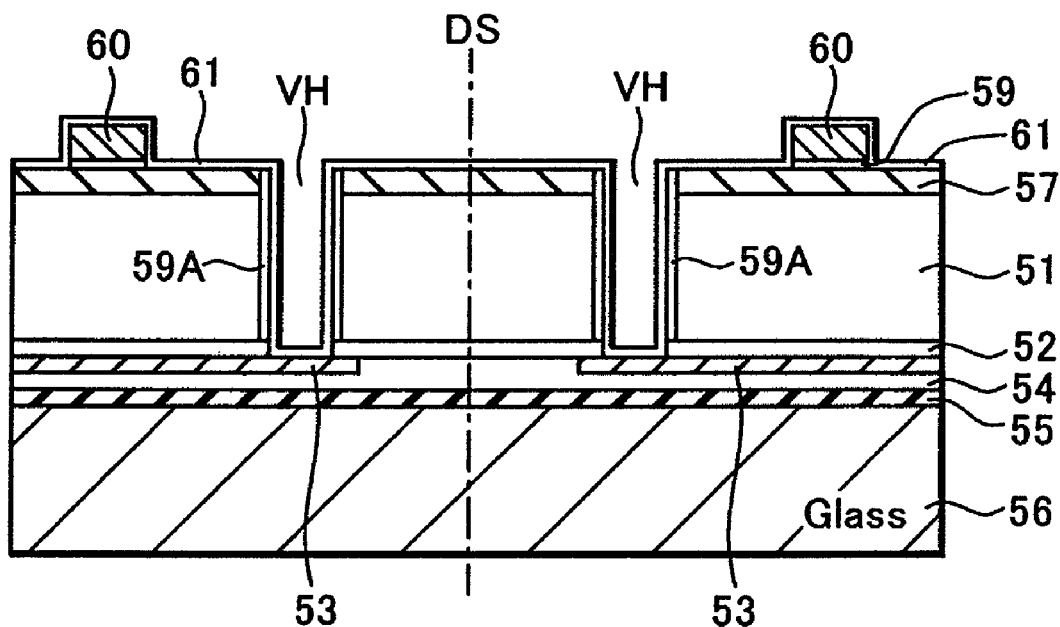
FIG. 6 is a cross-sectional view showing the manufacturing method of the semiconductor device according to the first embodiment of this invention.

Next, a process to form the wiring 63 is described. The seed layer 61 composed of a layer of copper (Cu), a layer of barrier metal such as titanium tungsten (TiW), titanium nitride (TiN) or tantalum nitride (TaN) or stacked layers of copper (Cu) and a barrier metal is formed on the entire back surface of the silicon wafer 51 including inside of the via holes VH by sputtering, MOCVD (Metal-Organic Chemical Vapor Deposition) or electroless plating, as shown in FIG. 6. The seed layer 61 is formed to be connected to the pad electrodes 53 and to cover the sidewall insulation films 59A in the via holes VH.

The seed layer 61 covers the cushioning pads 60 also. The layer of barrier metal of the seed layer 61 prevents copper (Cu) from diffusing into the silicon wafer 51 through the sidewall insulation film 59A. The seed layer 61 made only of copper (Cu) causes no problem when the sidewall insulation film 59A is formed of a SiN film, since the SiN film serves as a barrier against the diffusion of copper.

The seed layer 61 serves as a plating electrode for growth of plating during electrolytic plating. Thickness of about 1 μm is enough for it. The seed layer 61 may be formed by sputtering when the via holes VH are formed in the tapered down shape.

Figure 7:
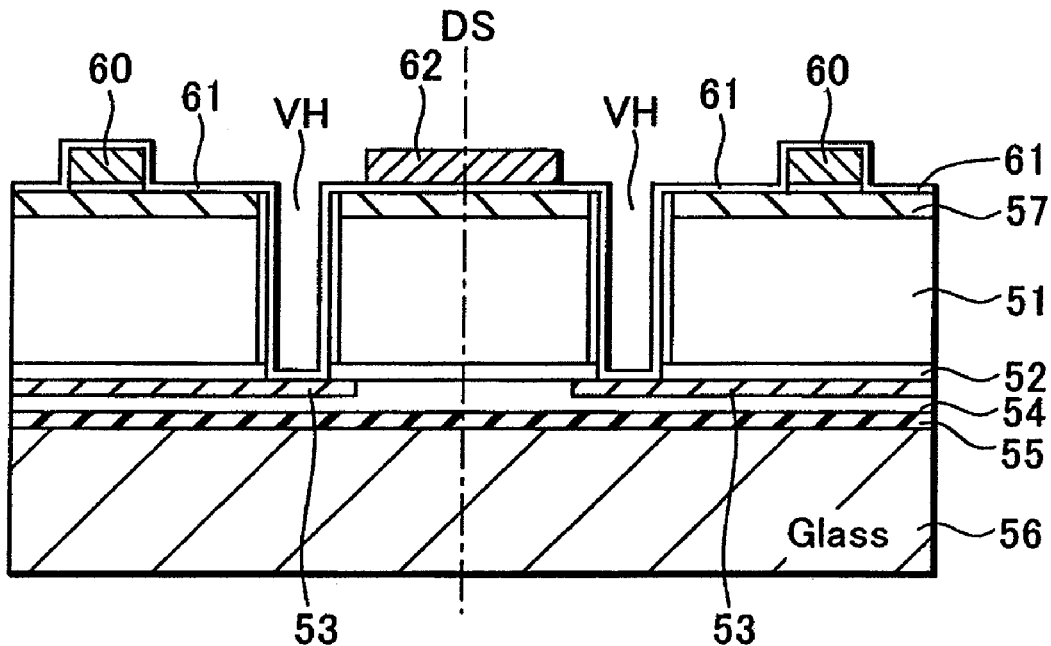
FIG. 7 is a cross-sectional view showing the manufacturing method of the semiconductor device according to the first embodiment of this invention.

A photoresist layer 62 is formed selectively on a region where the plating is not to be made (Refer to FIG. 7.), prior to electrolytic plating of copper (Cu). The region is a region except for regions to form the wirings 63 and the solder balls.

Figure 8:
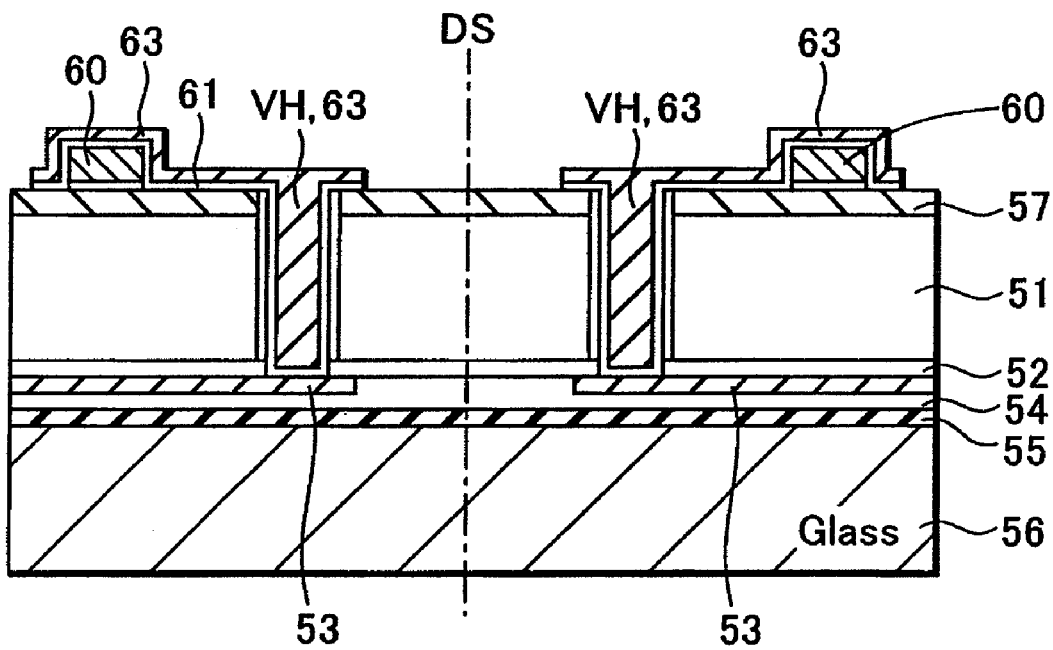
FIG. 8 is a cross-sectional view showing the manufacturing method of the semiconductor device according to the first embodiment of this invention.

Next, the wirings 63 are formed by electrolytic plating of copper (Cu), as shown in FIG. 8. The wirings 63 are drawn out from the via holes VH and extend over the back surface of the silicon wafer 51 to cover the cushioning pads 60. With this, the wirings 63 are electrically connected with the pad electrodes 53. Although the wirings 63 fill the via holes VH completely in FIG. 8, the wirings 63 may be formed to fill the via holes only partially by adjusting plating time.

The seed layer 61 is removed from a region under the photoresist layer 62 by etching using the wirings 63 as a mask. Although the wirings 63 are also etched in the process, it causes no problem since the wirings 63 are thicker than the seed layer 61.

Figure 9:
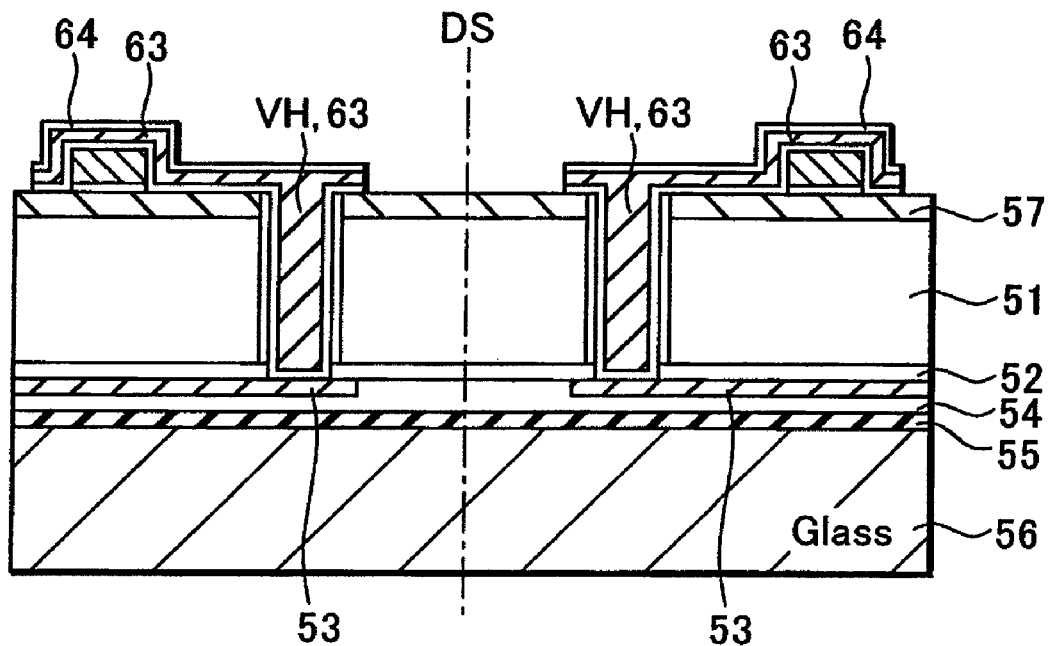
FIG. 9 is a cross-sectional view showing the manufacturing method of the semiconductor device according to the first embodiment of this invention.

Then the barrier layer 64 made of Ni/Au layer is formed on the wirings 63 by electroless plating or by sputtering of nickel (Ni) and gold (Au), as shown in FIG. 9.

Figure 10:
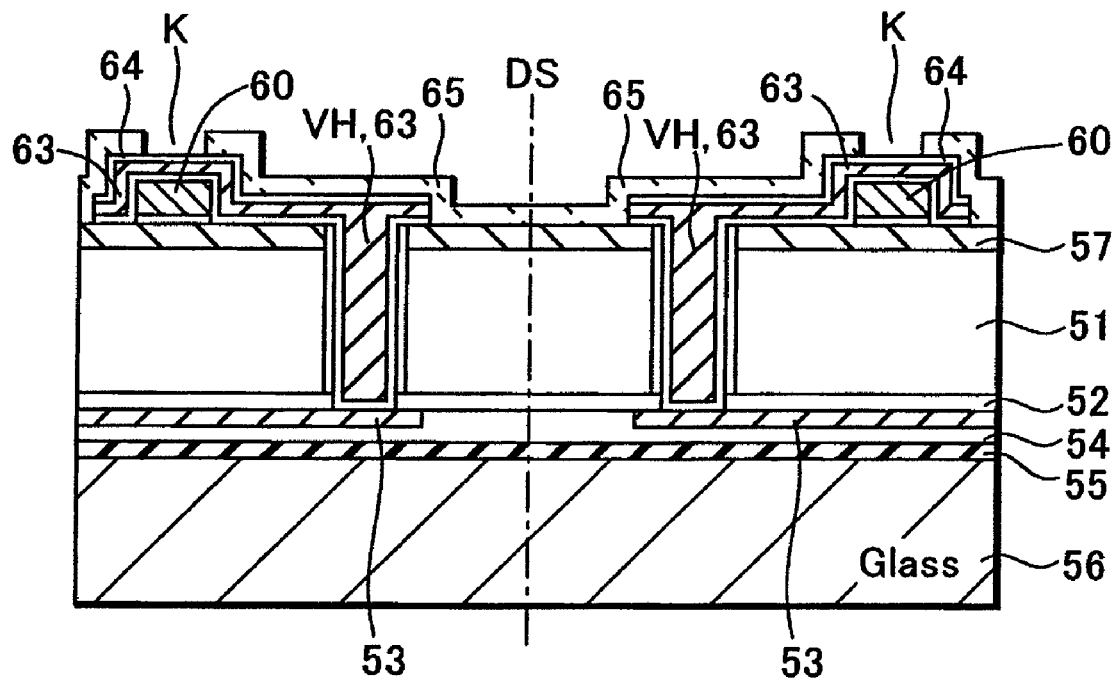
FIG. 10 is a cross-sectional view showing the manufacturing method of the semiconductor device according to the first embodiment of this invention.

Next, the wiring layer 63 is covered with the solder mask 65, as shown in FIG. 10. The solder mask 65 is removed from regions above the cushioning pads 60 to provide the openings K.

Figure 11:
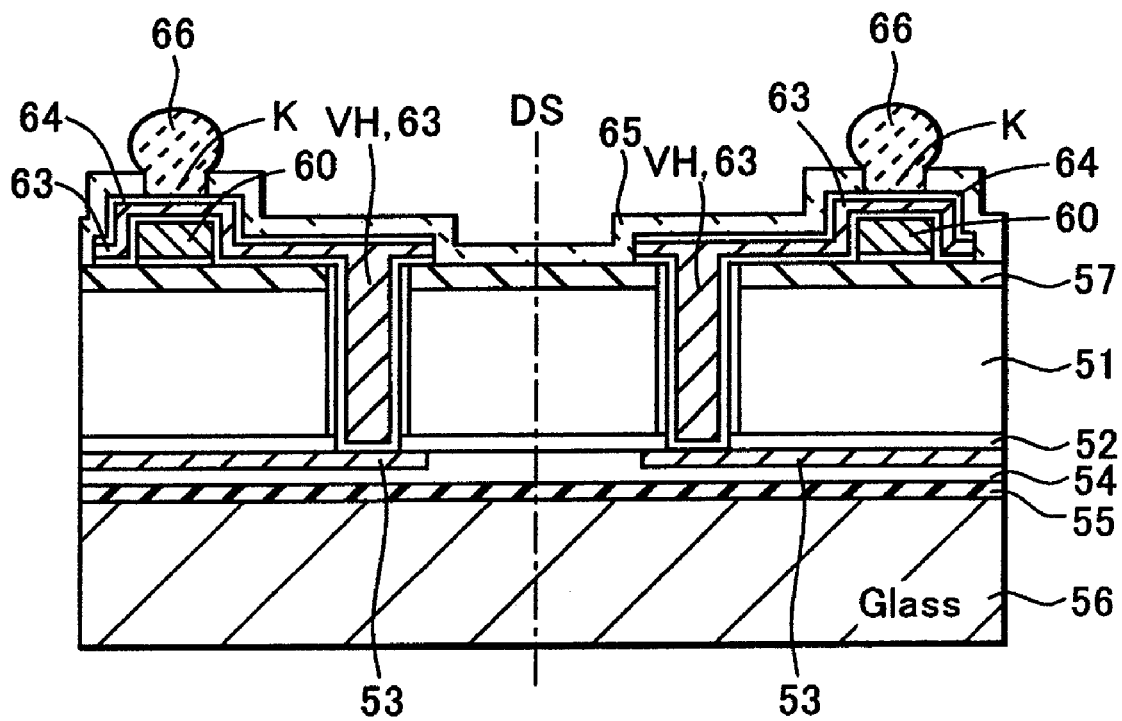
FIG. 11 is a cross-sectional view showing the manufacturing method of the semiconductor device according to the first embodiment of this invention.

A solder is printed on predetermined regions on the wirings 63 using screen printing, and the solder is reflowed by heat treatment to form the solder balls 66, as shown in FIG. 11. The solder balls 66 are not limited to the solder and may be formed using a lead-free low melting metal.

Note that desired number of the wirings 63 can be formed in desired regions on the back surface of the silicon wafer 51 and that number and locations of the solder balls 66 can be chosen at will.

The silicon wafer 51 is separated into a plurality of silicon dice 51A by dicing along the dicing line center DS, as shown in FIG. 12. A dicing blade or a laser beam may be used in the dicing process. Cracking of the glass substrate 56 may be prevented by making cut surfaces of the glass substrate 56 tapered in the dicing process.

Figure 15:
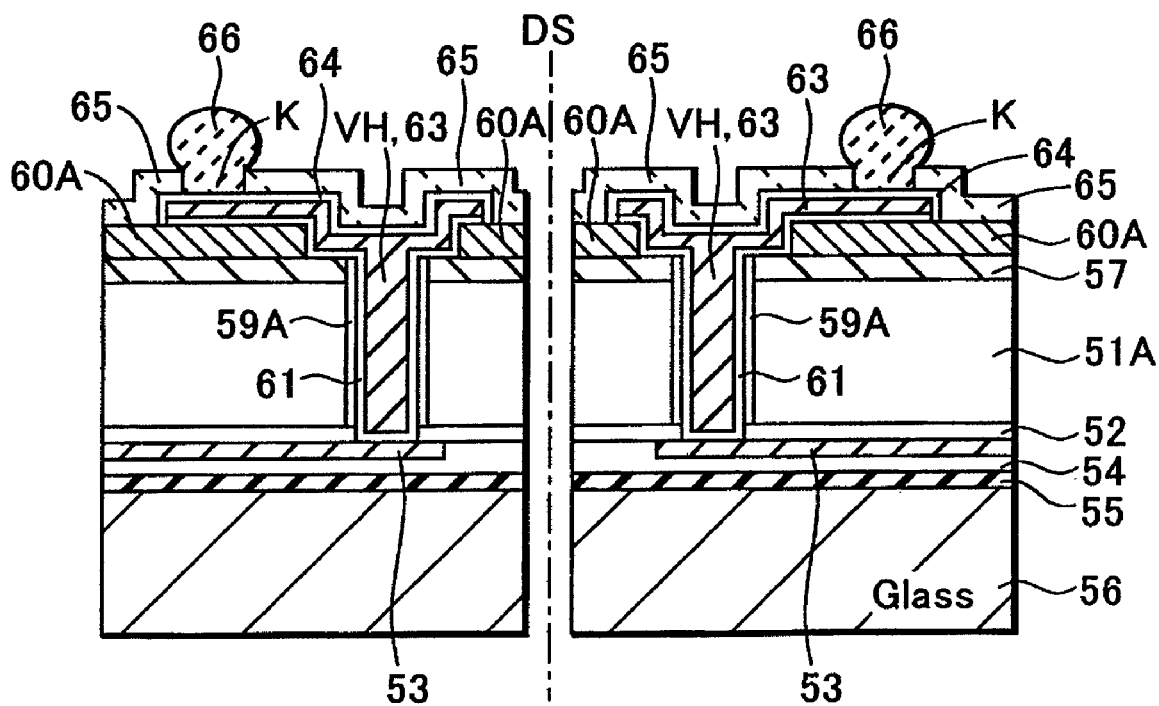
FIG. 15 is a cross-sectional view showing the manufacturing method of the semiconductor device according to the second embodiment of this invention.

Next, a second embodiment of this invention will be described in detail, referring to figures hereinafter. First, a structure of the semiconductor device will be described. FIG. 15 is a cross-sectional view of the semiconductor device separated into individual dice by dicing a silicon wafer along a dicing line after process steps to be described below.

DS in FIG. 15 denotes a center of the dicing line. The same reference numerals are used in FIG. 15 as in FIG. 12 for the common components, and detailed explanations on them are omitted.

Cushioning pads 60A are formed over the entire back surface of the silicon die 51A except for regions adjacent to the via holes VH in this embodiment. The wiring 63 extends from the via hole VH onto the cushioning pad 60A and terminate on the cushioning pad 60A. As a result, coverage of the wiring 64 and the solder mask 65 formed on the cushioning pad 60A is improved compared with the first embodiment. The other structural features are the same as in the first embodiment.

A manufacturing method of the semiconductor device according to the second embodiment will be described next. The manufacturing method is exactly the same as that in the first embodiment in process steps from the first process step through the process step to form the second insulation film 59 (process steps shown in FIGS. 1-3).

Figure 13:
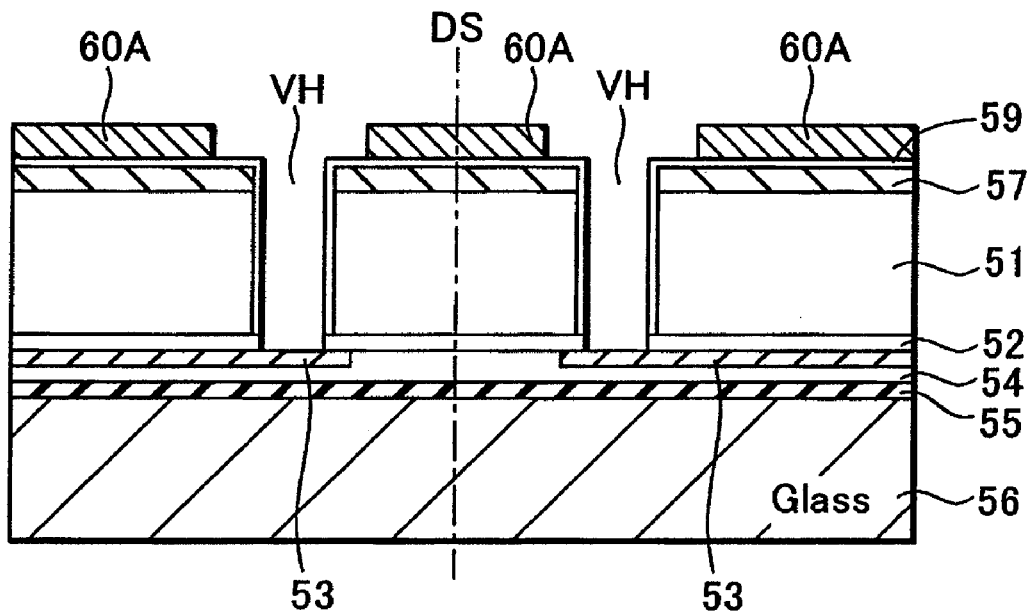
FIG. 13 is a cross-sectional view showing a manufacturing method of a semiconductor device according to a second embodiment of this invention.

After forming the second insulation film 59, the cushioning pads 60A are formed over the entire back surface of the silicon die 51A except for the regions adjacent to the via holes VH, as shown in FIG. 13.

Figure 14:
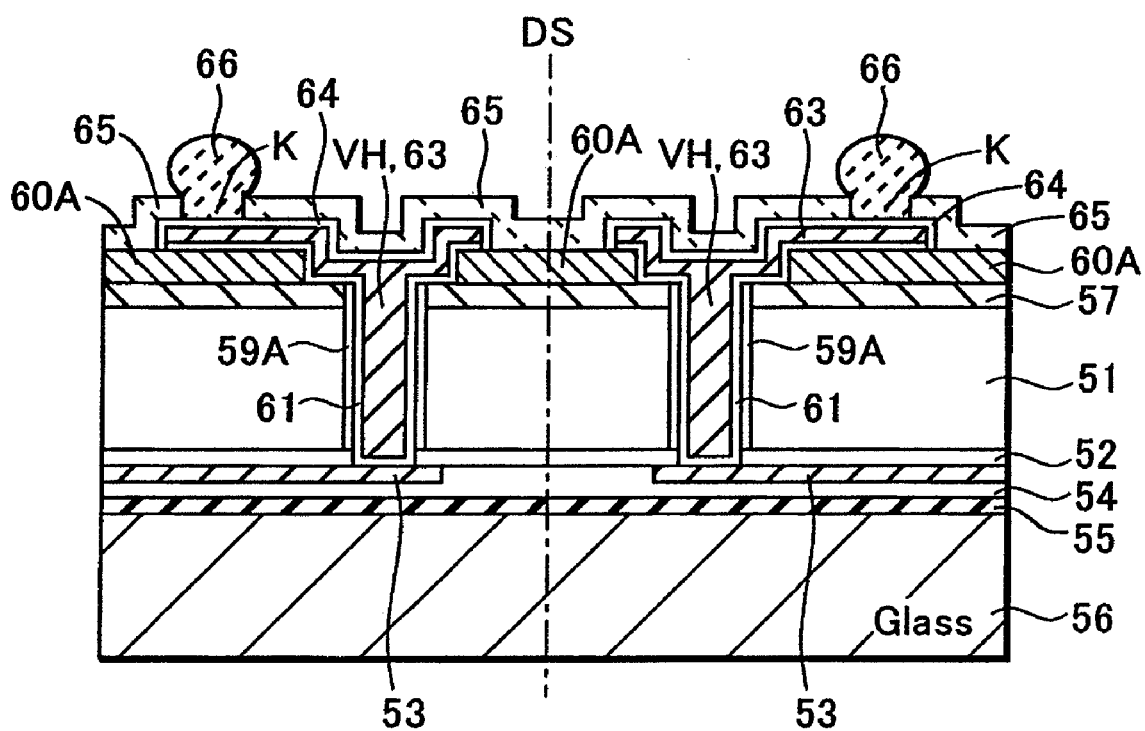
FIG. 14 is a cross-sectional view showing the manufacturing method of the semiconductor device according to the second embodiment of this invention.

Then the wirings 63, the solder masks 65 and the solder balls 66 are formed in the same way as in the first embodiment, as shown in FIG. 14. Next, the silicon wafer 51 is separated into the plurality of silicon dice 51A by dicing along the dicing line center DS, as shown in FIG. 15.

Next, a third embodiment of this invention will be described in detail, referring to figures hereinafter. Cushioning pads 73 are formed after forming wirings to fill the via holes in this embodiment, while the cushioning pads 60 and 60A are formed before forming the wirings 63 in the via holes VH in the first and the second embodiments.

Figure 16:
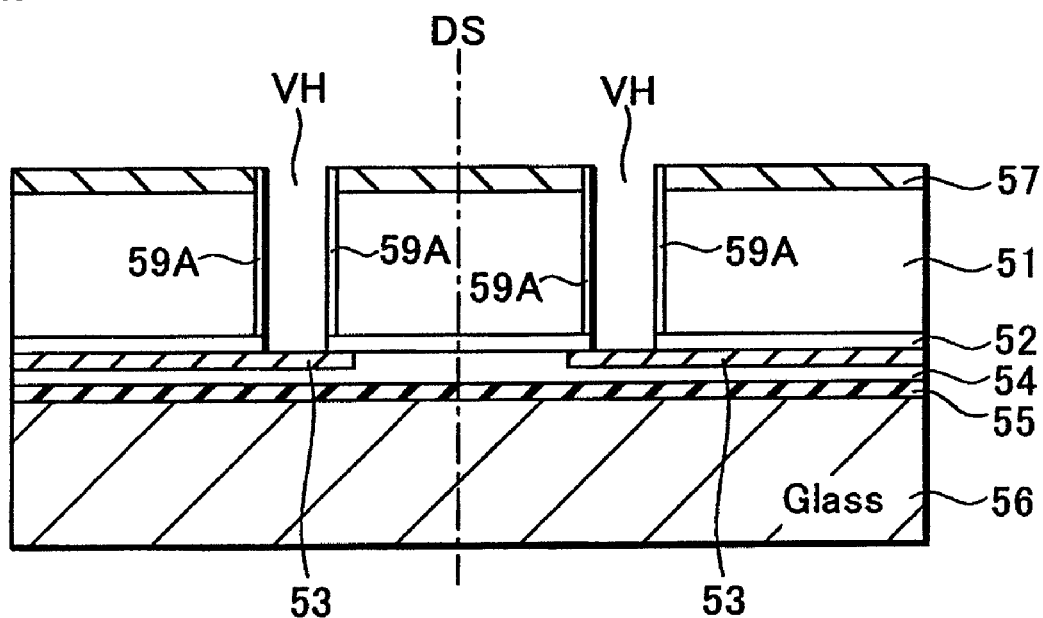
FIG. 16 is a cross-sectional view showing a manufacturing method of a semiconductor device according to a third embodiment of this invention.

More detailed explanation will be given hereafter referring to FIGS. 16-27. The second insulation film 59 and the interlayer insulation film 52 at the bottom of the via hole VH are removed by etching to expose the pad electrode 53, as shown in FIG. 16. The third embodiment is different from the first embodiment only in that the cushioning pads 73 are not yet formed at this step of manufacturing.

Figure 17:
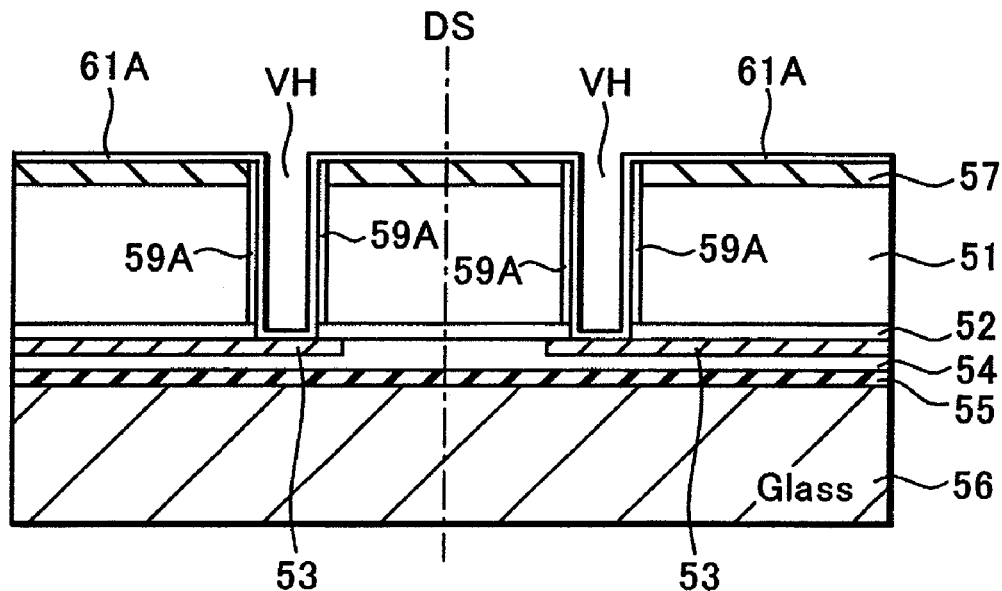
FIG. 17 is a cross-sectional view showing the manufacturing method of the semiconductor device according to the third embodiment of this invention.

A seed layer 61A made of a layer of copper (Cu), a layer of barrier metal such as titanium tungsten (TiW), titanium nitride (TiN) or tantalum nitride (TaN) or stacked layers of copper (Cu) and a barrier metal is formed on the entire back surface of the silicon wafer 51 including inside of the via holes VH by sputtering, MOCVD or electroless plating, as shown in FIG. 17.

The seed layer 61A is formed to be connected to the pad electrodes 53 and to cover the sidewall insulation films 59A in the via holes VH. The seed layer 61A serves as a plating electrode for growth of plating during electrolytic plating. Thickness of about 1 μm is enough for it. The seed layer 61A may be formed by sputtering when the via holes VH are formed in the tapered down shape.

Figure 18:
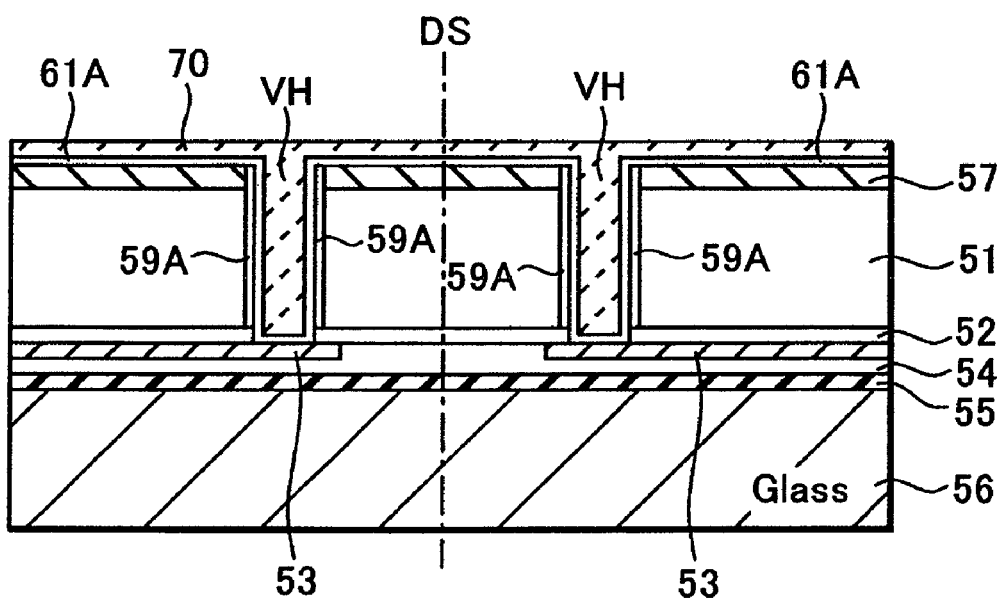
FIG. 18 is a cross-sectional view showing the manufacturing method of the semiconductor device according to the third embodiment of this invention.

A plating layer 70 is formed on the entire back surface of the silicon wafer 51 including inside of the via holes VH by electrolytic plating of copper (Cu), as shown in FIG. 18. The via holes VH are filled with the plating layer 70 completely or only partially.

Figure 19:
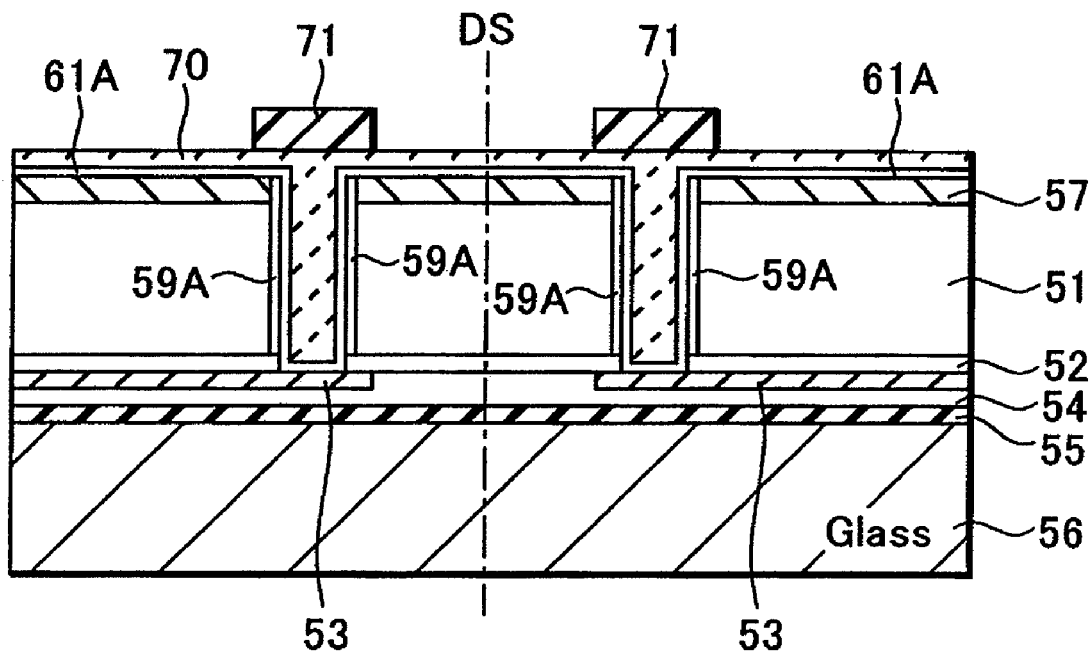
FIG. 19 is a cross-sectional view showing the manufacturing method of the semiconductor device according to the third embodiment of this invention.

A photoresist layer 71 is selectively formed on portions of the plating layer 70 filling the via holes VH by exposure and development, as shown in FIG. 19.

Figure 20:
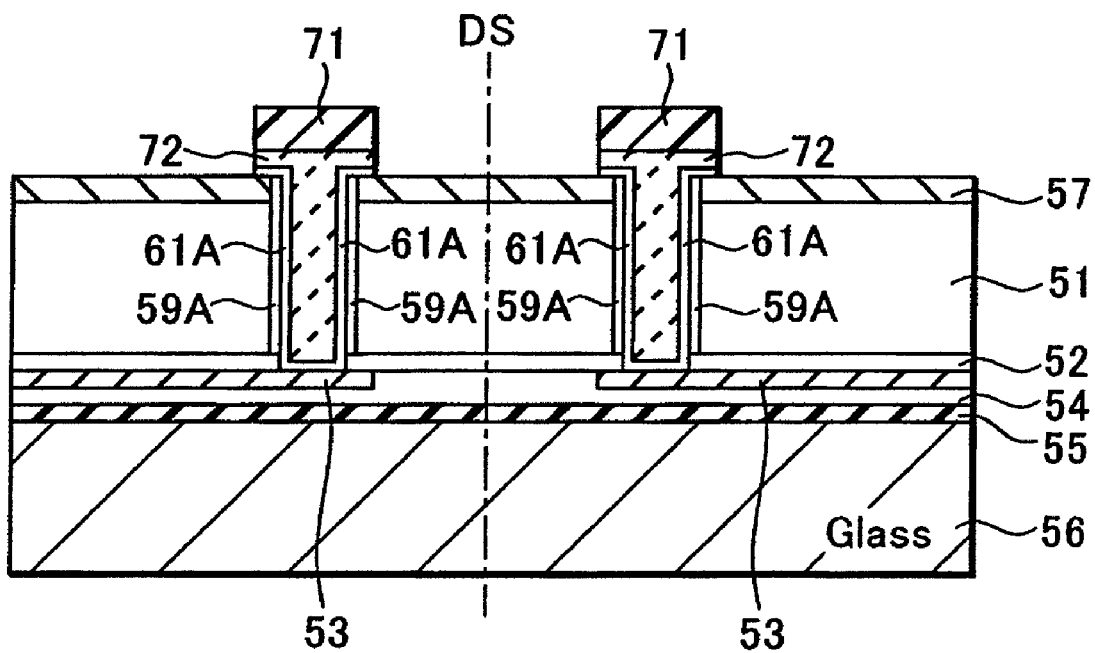
FIG. 20 is a cross-sectional view showing the manufacturing method of the semiconductor device according to the third embodiment of this invention.

Next, the plating layer 70 and the underlying seed layer 61A are removed by etching from regions not covered with the photoresist layer 71 which serves as an etching mask, as shown in FIG. 20. As a result, a buried electrode 72 buried in the via hole VH is formed under the photoresist layer 71.

Figure 21:
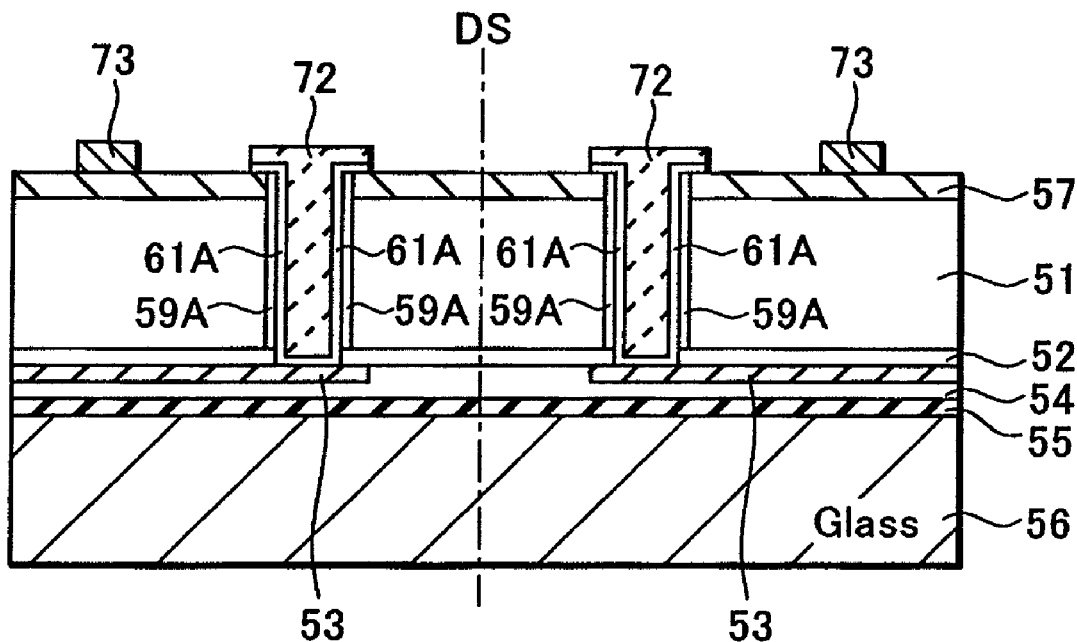
FIG. 21 is a cross-sectional view showing the manufacturing method of the semiconductor device according to the third embodiment of this invention.

After removing the photoresist layer 71, the cushioning pad 73 is formed on the first insulation film 57 adjacent the buried electrode 72, as shown in FIG. 21.

Figure 22:
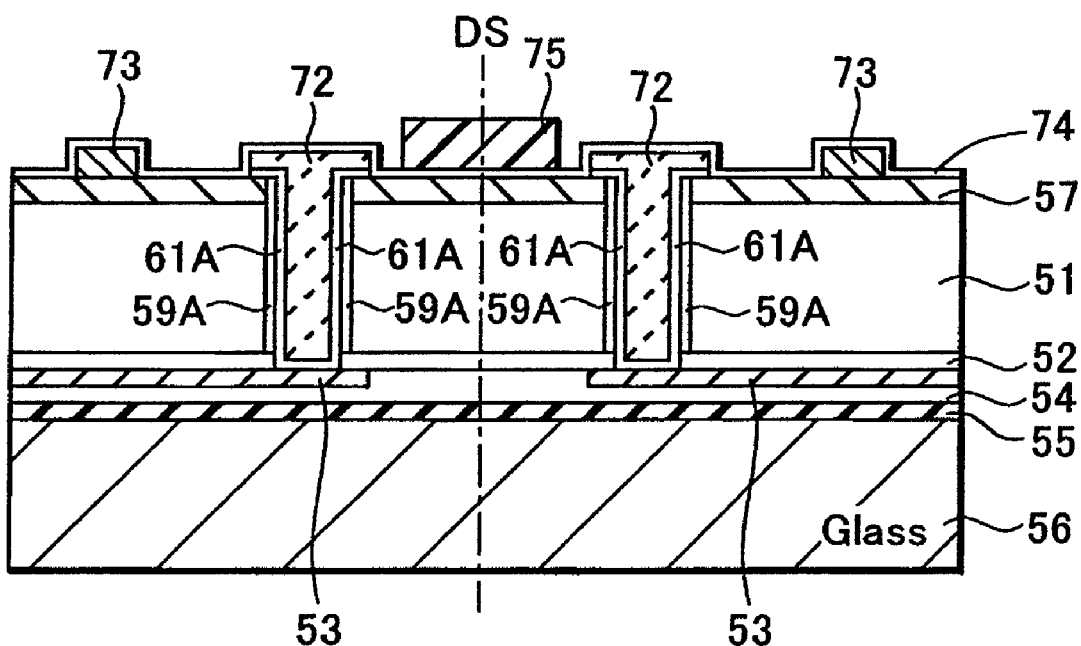
FIG. 22 is a cross-sectional view showing the manufacturing method of the semiconductor device according to the third embodiment of this invention.

Next, another seed layer 74 is formed on the entire back surface of the silicon wafer 51, as shown in FIG. 22. A barrier film such as TiN may be formed between the seed layer 74 and the first insulation film 57 in order to improve adhesiveness of the seed layer 74 to the first insulation film 57. It is effective especially when the first insulation film 57 is made of SiN.

Then a photoresist layer 75 is formed on the seed layer 74. The photoresist layer 75 is formed selectively on regions where a plating film is not to be formed. The seed layer 74 is made of Cu layer or Cu/Cr layer.

Figure 23:
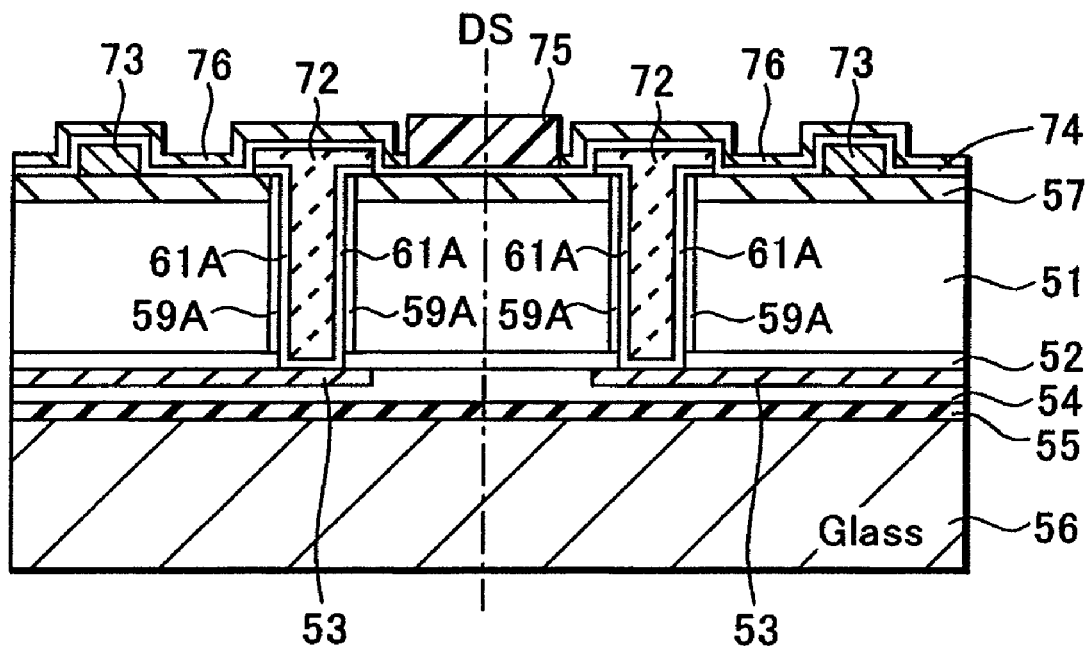
FIG. 23 is a cross-sectional view showing the manufacturing method of the semiconductor device according to the third embodiment of this invention.

Then wiring 76 is formed by electrolytic plating of copper (Cu), as shown in FIG. 23. The wiring 76 is connected with the buried electrode 72 by covering it entirely or partially, and is extended to cover the cushioning pad 73.

Figure 24:
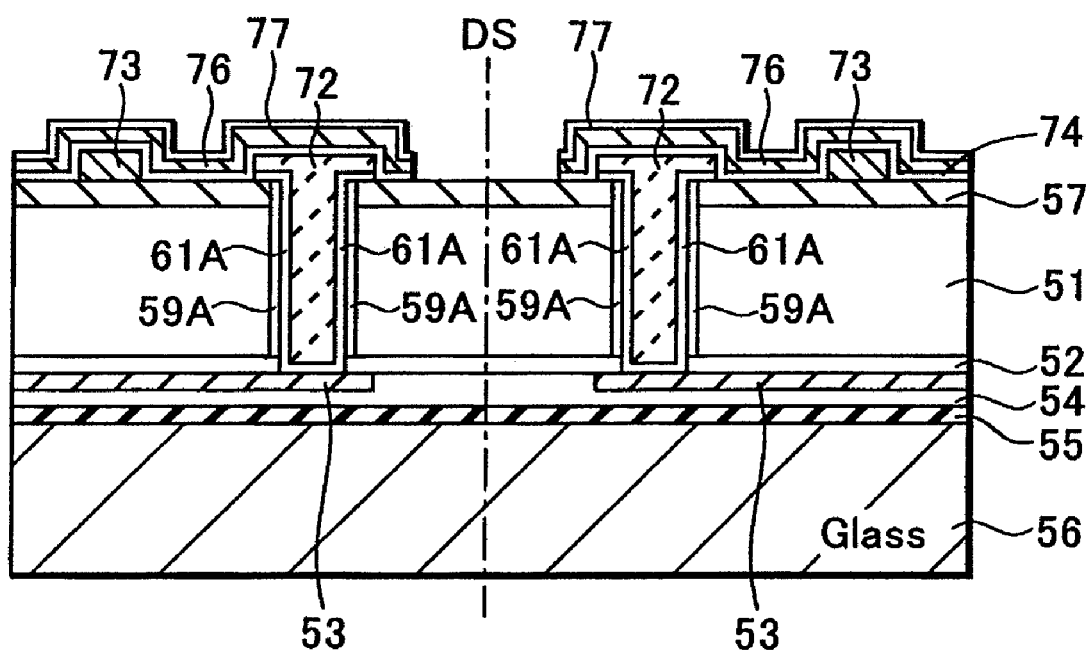
FIG. 24 is a cross-sectional view showing the manufacturing method of the semiconductor device according to the third embodiment of this invention.

Next, after removing the photoresist layer 75, a barrier layer 77 consisting of Ni/Au layer is formed on the wiring 76 by electroless plating of nickel (Ni) and gold (Au), as shown in FIG. 24.

Instead of forming the wiring 76 by electrolytic plating as described above, the wiring 76 may be formed by sputtering to form a film of aluminum or aluminum alloy on the entire surface of the silicon wafer 51 followed by lithography and selective etching. In this case, it is preferable that a barrier film (a film to prevent Cu from diffusing) such as a film of Ni or TiN is formed by electroless plating between the film of aluminum or aluminum alloy and the buried electrode 72 made of Cu.

Figure 25:
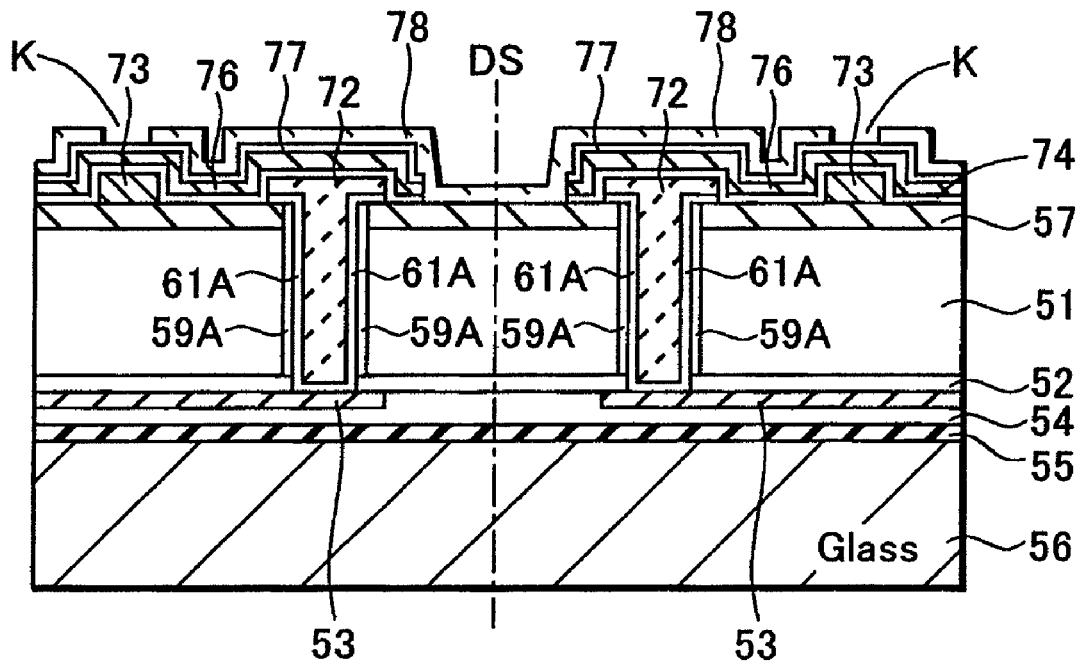
FIG. 25 is a cross-sectional view showing the manufacturing method of the semiconductor device according to the third embodiment of this invention.

Next, the wiring 76 covered by the barrier layer 77 is covered with a solder mask 78, as shown in FIG. 25. The solder mask 78 is removed from regions above the cushioning pads 73 to provide the openings K.

Figure 26:
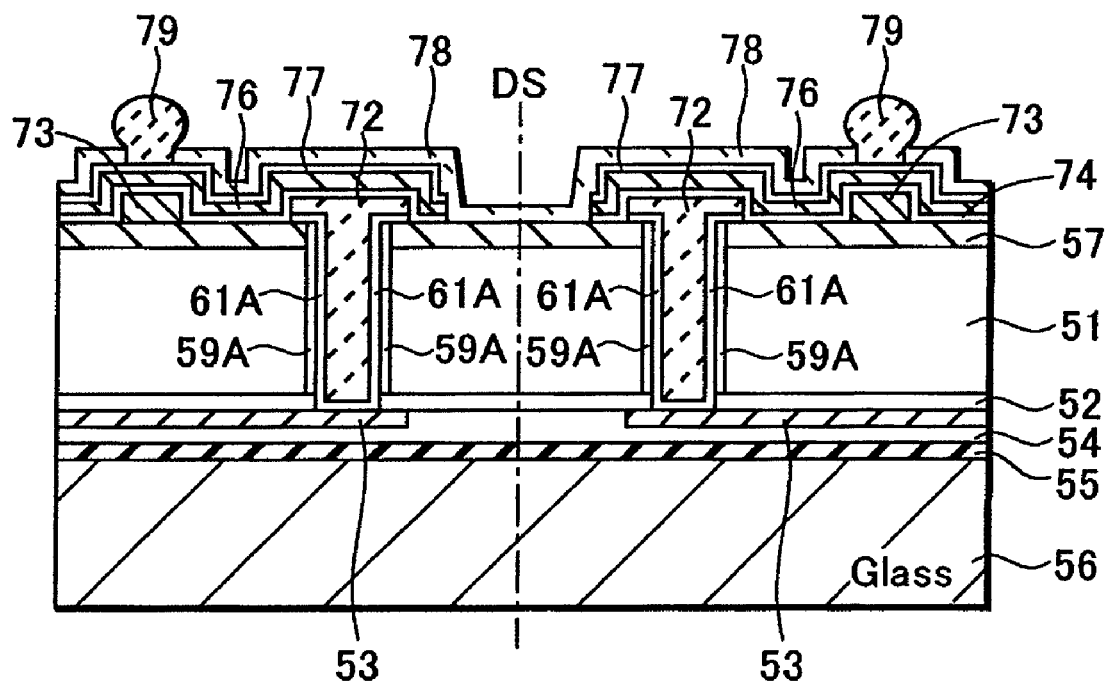
FIG. 26 is a cross-sectional view showing the manufacturing method of the semiconductor device according to the third embodiment of this invention.

Next, solder is printed on regions on the wirings 76 exposed by the openings K and covered with the barrier layer 77 using screen printing, and the solder is reflowed by heat treatment to form the solder balls 79, as shown in FIG. 26. Desired number of the wirings 76 can be formed in desired regions on the back surface of the silicon wafer 51. Also the number and the locations of the solder balls 66 can be chosen at will.

Figure 27:
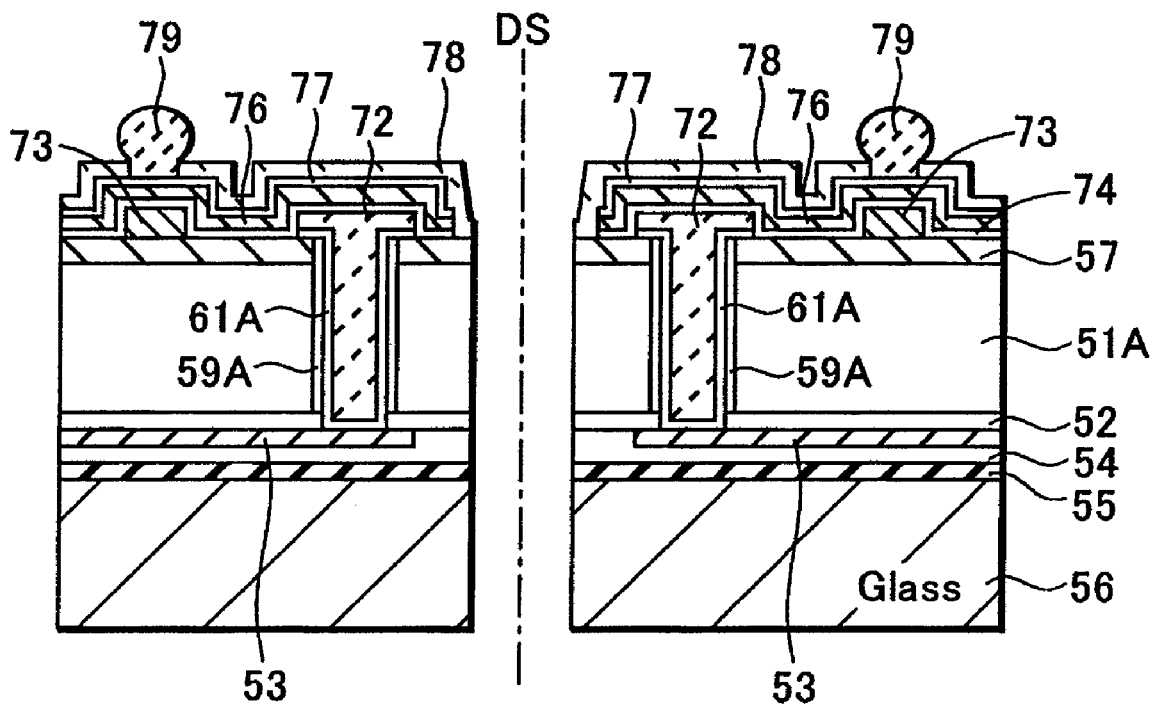
FIG. 27 is a cross-sectional view showing the manufacturing method of the semiconductor device according to the third embodiment of this invention.
Figure 28A:
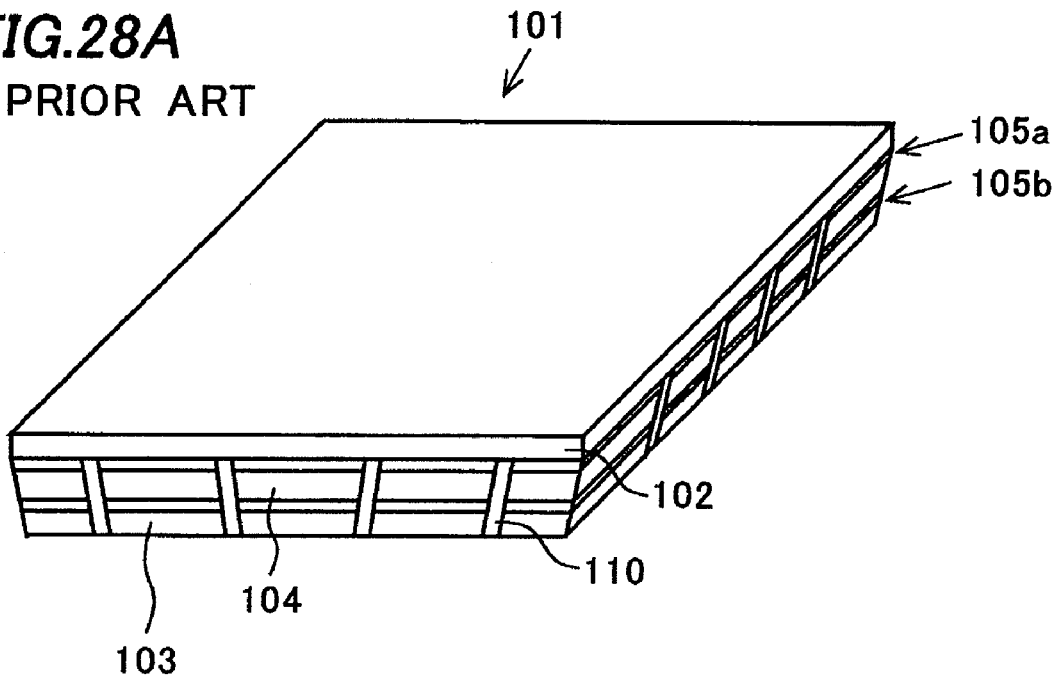
FIG. 28 is a cross-sectional view showing a semiconductor device according to a conventional art.
Figure 28B:
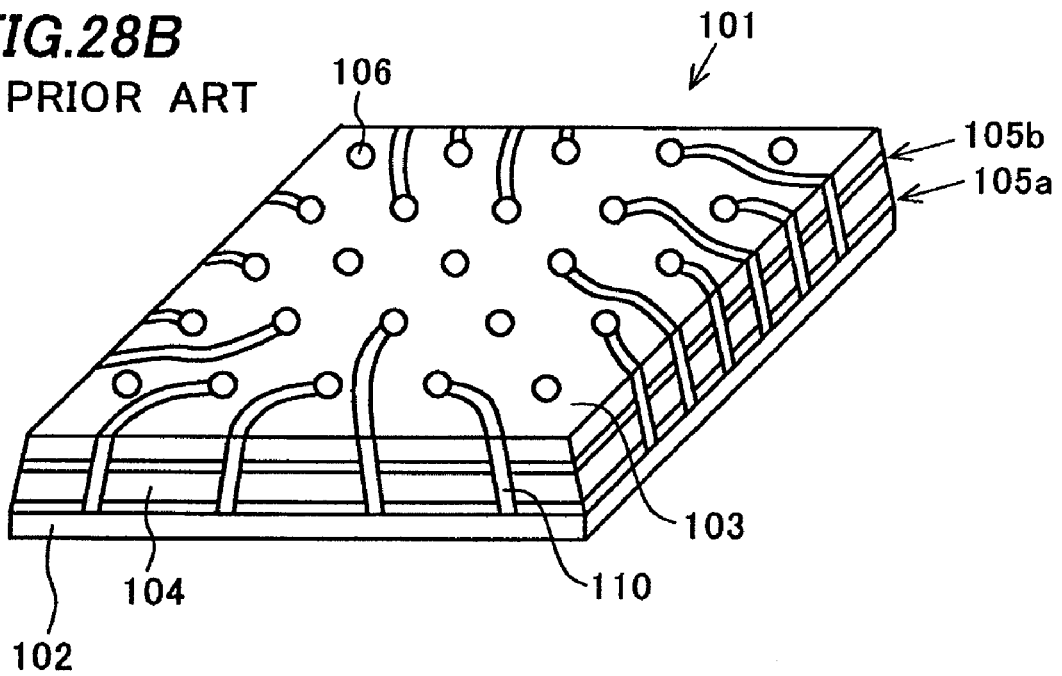
Figure 29:
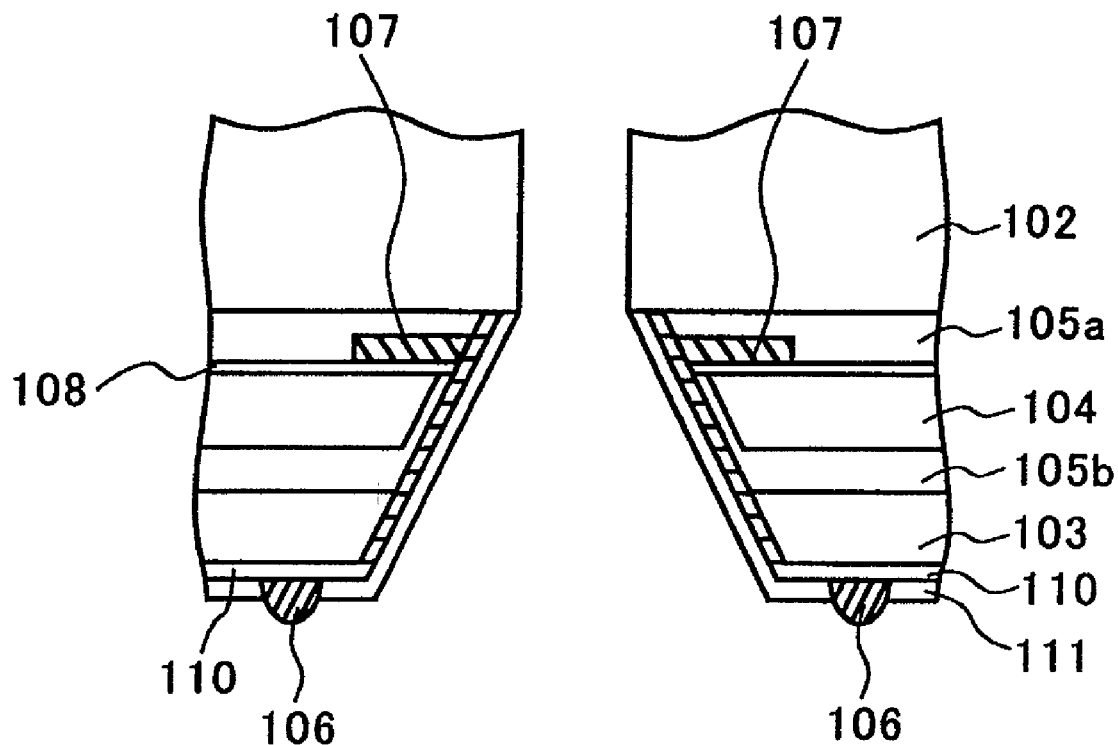
FIG. 29 is a cross-sectional view showing the semiconductor device according to the conventional art.

The silicon wafer 51 is separated into a plurality of silicon dice 51A by dicing along the dicing line center DS, as shown in FIG. 27. A dicing blade or a laser beam may be used in the dicing process. Cracking of the glass substrate 56 may be prevented by making cut surfaces of the glass substrate 56 tapered in the dicing process.

The via hole VH is filled with the wiring 64 or 64A formed by electrolytic plating in the first and the second embodiments and filled with the buried electrode 72 formed by electrolytic plating in the third embodiment as described above. However this invention is not limited to the above and other methods may be used. A method filling the via hole VH with metal such as copper (Cu) by CVD or MOCVD may be used.

Furthermore, this invention is not limited to including the pad electrode 53 formed by extending a normal pad electrode used for wire bonding to the dicing line region DL as described above in the first, the second and the third embodiments. The normal pad electrode used for wire bonding not extended to the dicing line region DL may be used instead of the pad electrode 53. In this case, only a location to form the via hole VH is required to be adjusted to a location of the normal pad, leaving other manufacturing process steps unchanged.

Disconnection and deterioration in step coverage of the wiring everywhere in between the pad electrode on the semiconductor die and the conductive terminal can be prevented according to this invention, leading to a BGA type semiconductor device of higher reliability. Also because the conductive terminal is formed on the cushioning pad, an impact of mounting the semiconductor device on a printed circuit board is relieved to prevent damage to the semiconductor device.

Furthermore, the conductive terminal is formed at a location elevated by a thickness of the cushioning pad above the second surface of the semiconductor die. This makes it easier to absorb stress caused in mounting the semiconductor device on the printed circuit board, enabling preventing damage to the conductive terminal.

What is claimed is:

1. A method of manufacturing a semiconductor device, comprising:
    bonding a supporting substrate to a first surface of a semiconductor substrate on which a pad electrode is formed;
    forming a via hole in the semiconductor substrate connecting a second surface of the semiconductor substrate and a surface of the pad electrode;
    forming an insulation film on the second surface of the semiconductor substrate and an inside wall of the via hole;
    removing the insulation film at a bottom portion of the via hole to expose the pad electrode in the via hole;
    forming a wiring contacting the exposed pad electrode through the via hole and extending over the second surface from the via hole;
    forming a conductive terminal on the wiring; and
    dividing the semiconductor substrate so as not to cut through the via hole and so as to produce a semiconductor die having the via hole.

2. The method of claim 1, wherein the wiring is formed by electrolytic plating or sputtering.

3. The method of claim 1, further comprising forming a cushioning pad on the insulation film excluding a region adjacent the via hole.

4. The method of claim 1, wherein the following conditions are met:

$$0.7 K_s \leq K_g \leq 1.3 K_s$$

where $K_g$ denotes a thermal expansion coefficient of the supporting substrate and $K_s$ denotes a thermal expansion coefficient of the semiconductor substrate.

5. The method of claim 1, wherein the supporting substrate is a glass substrate on which no wiring is formed.

6. The method of claim 1, further comprising a resin layer bonding the supporting substrate to a passivation film formed on the pad electrode.

7. The method of claim 1, wherein the wiring completely fills the via hole.

8. A method of manufacturing a semiconductor device, comprising:
- bonding a supporting substrate to a first surface of a semiconductor substrate on which a pad electrode is formed;
- forming a via hole in the semiconductor substrate connecting a second surface of the semiconductor substrate and a surface of the pad electrode;
- forming an insulation film on the second surface of the semiconductor substrate and an inside wall of the via hole;
- removing the insulation film at a bottom portion of the via hole to expose the pad electrode in the via hole;
- forming a buried electrode in the via hole so that the buried electrode is in contact with the exposed pad electrode;
- forming a cushioning pad on the second surface;
- forming a wiring connected with the buried electrode and extending over the cushioning pad;
- forming a conductive terminal on the wiring; and
- dividing the semiconductor substrate so as not to cut through the via hole and so as to produce a semiconductor die having the via hole.

9. The method of claim 8, wherein the buried electrode is formed by electrolytic plating or sputtering.

10. The method of claim 8, wherein the wiring is formed by electrolytic plating or sputtering.

11. The method of claim 8, wherein the following conditions are met:

$$0.7K_s \leq K_g \leq 1.3K_s$$

where $K_g$ denotes a thermal expansion coefficient of the supporting substrate and $K_s$ denotes a thermal expansion coefficient of the semiconductor substrate.

12. The method of claim 8, wherein the supporting substrate is a glass substrate on which no wiring is formed.

13. The method of claim 8, further comprising a resin layer bonding the supporting substrate to a passivation film formed on the pad electrode.

14. The method of claim 8, wherein the wiring completely fills the via hole.

* * * * *